(12) United States Patent
Kawana et al.

(10) Patent No.: US 7,785,768 B2
(45) Date of Patent: Aug. 31, 2010

(54) THERMOACID GENERATOR FOR ANTIREFLECTION FILM FORMATION, COMPOSITION FOR ANTIREFLECTION FILM FORMATION, AND ANTIREFLECTION FILM MADE THEREFROM

(75) Inventors: Daisuke Kawana, Kawasaki (JP); Yasushi Fujii, Kawasaki (JP); Hisanobu Harada, Kawasaki (JP); Naoki Yamashita, Kawasaki (JP)

(73) Assignee: Tokyo Ohka Kogyo Co. Ltd. (JP)

( * ) Notice: Subject to any disclaimer, the term of this patent is extended or adjusted under 35 U.S.C. 154(b) by 179 days.

(21) Appl. No.: 11/916,575

(22) PCT Filed: May 24, 2006

(86) PCT No.: PCT/JP2006/310392

§ 371 (c)(1),
(2), (4) Date: Dec. 5, 2007

(87) PCT Pub. No.: WO2006/132089

PCT Pub. Date: Dec. 14, 2006

(65) Prior Publication Data

US 2009/0130595 A1 May 21, 2009

(30) Foreign Application Priority Data

Jun. 7, 2005 (JP) .............................. 2005-167043

(51) Int. Cl.
G03F 7/11 (2006.01)
H01L 21/027 (2006.01)
(52) U.S. Cl. ...................... 430/272.1; 528/21; 558/268; 560/103; 560/104; 560/135
(58) Field of Classification Search ........................ None
See application file for complete search history.

(56) References Cited

U.S. PATENT DOCUMENTS

| | | | | | |
|---|---|---|---|---|---|
| 5,399,596 | A | * | 3/1995 | Kouge et al. .................. 522/31 |
| 5,554,664 | A | * | 9/1996 | Lamanna et al. ............... 522/25 |
| 5,747,599 | A | * | 5/1998 | Ohnishi .................... 525/327.3 |
| 5,798,396 | A | * | 8/1998 | Takahashi et al. ............. 522/15 |
| 6,165,684 | A | | 12/2000 | Mizutani et al. |
| 6,808,869 | B1 | | 10/2004 | Mizutani et al. |
| 6,818,379 | B2 | * | 11/2004 | Kamabuchi et al. ...... 430/270.1 |
| 2004/0009429 | A1 | * | 1/2004 | Sato ......................... 430/287.1 |
| 2004/0063804 | A1 | * | 4/2004 | Takeda et al. ................ 522/122 |
| 2004/0191479 | A1 | * | 9/2004 | Hatakeyama et al. ....... 428/141 |
| 2004/0202942 | A1 | * | 10/2004 | Takeyama ...................... 430/1 |
| 2005/0042538 | A1 | * | 2/2005 | Babich et al. ............ 430/270.1 |
| 2007/0065748 | A1 | * | 3/2007 | Hada et al. ................ 430/270.1 |
| 2009/0098490 | A1 | * | 4/2009 | Pham et al. .................. 430/327 |

FOREIGN PATENT DOCUMENTS

| | | | |
|---|---|---|---|
| CA | 2049772 | A1 * | 2/1992 |
| EP | 0 393 893 | A1 * | 10/1990 |
| JP | 03-237107 | A | 10/1991 |
| JP | 03-237107 | A | 10/1991 |
| JP | 06-236036 | A | 8/1994 |
| JP | 2002-207295 | A | 7/2002 |
| JP | 2003-255542 | A | 9/2003 |
| JP | 2004-310019 | A | 11/2004 |
| JP | 2005-015779 | A | 1/2005 |
| JP | 2005-018054 | A | 1/2005 |
| JP | 2005-70776 | A | 3/2005 |
| WO | WO-2004/108780 | A1 * | 12/2004 |

OTHER PUBLICATIONS

Hamazu et al, Journal of Polymer Science: Part A: polymer Chemistry, vol. 29, pp. 1845-1851, year 1991 no month given.*
PCT/JP2006/310392 Int'l Search Report, Jun. 15, 2006, Tokyo Ohka Kogyo Co., Ltd.

* cited by examiner

Primary Examiner—Cynthia Hamilton
(74) Attorney, Agent, or Firm—Pattric J. Rawlins; Procopio Cory Hargreaves & Savitch LLP

(57) ABSTRACT

A thermoacid generator for antireflective film formation, characterized by being represented by the following formula (1):

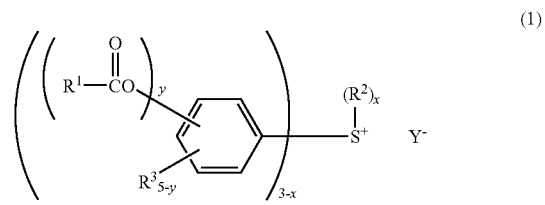

(wherein $R^1$ represents $C_{1-20}$ alkyl, alkenyl, oxoalkyl, or oxoalkenyl (hydrogen atoms in these groups may have been replaced with fluorine atoms); $R^2$ represents linear, branched, or cyclic $C_{1-20}$ alkyl, alkenyl, oxoalkyl, or oxoalkenyl, $C_{6-20}$ aryl, or $C_{7-12}$ aralkyl or aryloxoalkyl; $R^3$ represents hydrogen or alkyl; and $Y^-$ represents a non-nucleophilic counter ion); a composition for forming an antireflective film; and an antireflective film made from the composition. With the thermoacid generator and composition, satisfactory etching resistance and the satisfactory ability to prevent the reflection of short-wavelength light (ability to absorb short-wavelength light) are attained. Furthermore, the antireflective film can inhibit an overlying photoresist film from generating a scum.

7 Claims, No Drawings

THERMOACID GENERATOR FOR ANTIREFLECTION FILM FORMATION, COMPOSITION FOR ANTIREFLECTION FILM FORMATION, AND ANTIREFLECTION FILM MADE THEREFROM

TECHNICAL FIELD

The present invention relates to a composition for formation of an antireflective film, which is used for microfabrication in manufacturing steps of integrated circuit elements and the like, and a pattern formation method using the same. More particularly, the present invention relates to a thermal acid generator for formation of an antireflective film and a composition for formation of an antireflective film, and antireflective film that is suitable for forming a pattern through exposing light having a wavelength of 300 nm or less.

BACKGROUND ART

In manufacturing integrated circuit elements, there has been progress in miniaturization of processing size in lithography processes with a view to obtaining integrated circuits with a high degree of integration. In these lithography processes, a resist pattern is formed by coating a photoresist composition on a workpiece layer, followed by exposure and development, and the resist pattern thus formed is transferred to a workpiece film such as a wiring layer, a dielectric layer or the like. Conventionally, an exposed region of the workpiece film, being the region exposed in the resist pattern, was removed by dry etching. However, film thickness of the resist layer (i.e., the resist pattern) was decreased by shortening the wavelength of the light source for exposure or the like, accompanied by miniaturization of the processing size. Therefore, sufficient dry etching resistance cannot be acquired, thereby making the processing of the workpiece film with high accuracy difficult to achieve. Also, due to a problem of reflection of the exposed light on the workpiece film, it is difficult to form a resist pattern in a favorable shape.

Hence, for transferring a resist pattern to a workpiece film with good accuracy, insertion of an antireflective film (hard mask) between the workpiece film and the photo resist layer has been studied. As a characteristic of this antireflective film the etching rate is required to have a large difference from that of the resist pattern (see, for example, Patent Documents 1 to 3).

Patent Document 1: Japanese Unexamined Patent Application Publication No. 2004-310019
Patent Document 2: Japanese Unexamined Patent Application Publication No. 2005-015779
Patent Document 3: Japanese Unexamined Patent Application Publication No. 2005-018054

DISCLOSURE OF THE INVENTION

Problems to be Solved by the Invention

The antireflective film as disclosed in the above-mentioned Patent Documents, the reflection of the exposure light can be prevented. However, it is difficult to suppress scum generation in the upper layer of the antireflective film. Such scum is unpreferable since it disturbs the subsequent etching.

The present invention was made in view of the foregoing problems, and an object of the invention is to provide a thermal acid generator for formation of an antireflective film and a composition for formation of an antireflective film, and an antireflective film with favorable etching resistant characteristics and ability to prevent reflection of short-wavelength light (absorption ability of short-wavelength light) and even more particularly the generation of scum in upper layer of the photoresist film.

Means for Solving the Problems

The composition for formation of an antireflective film of the present invention is represented by the following formula (1),

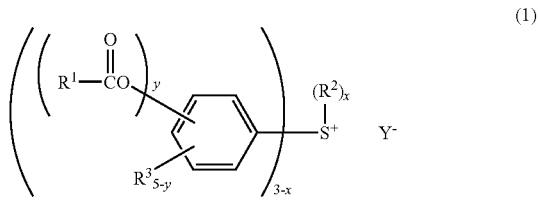

wherein $R^1$ represents an alkyl group, an alkenyl group, an oxo-alkyl group or an oxo-alkenyl group (a hydrogen atom in these groups may be substituted with a fluorine atom); $R^2$ represents an alkyl group, an alkenyl group, an oxo-alkyl or oxo-alkenyl group, an aryl group, or an aralkyl or aryloxo-alkyl group; $R^3$ represents a hydrogen atom or an alkyl group; x represents an integer of 0 to 2; y represents an integer of 1 to 5; two $R^2$s may form a ring when x is 2; $R^2$ represents an alkylene group having 1 to 12 carbons when the ring is formed; and $Y^-$ represents a non-nucleophilic opposed ion.

A composition for formation of an antireflective film of the present invention includes the acid generator for formation of the antireflective film and a silicon-containing compound having a light-absorbing group and a crosslinking group.

Since the acid generator for formation of the antireflective film is used, generation of an undercut profile or scum can be prevented after the resist layer formed on the antireflective film, which is formed with the composition for formation of the antireflective film is developed.

Effects of the Invention

Use of the composition for formation of an antireflective film in the present invention enables formation of a pattern with high dimensional accuracy.

PREFERRED MODE FOR CARRYING OUT THE INVENTION

The thermal acid generator for antireflective film formation in the present invention is shown in the following formula (1).

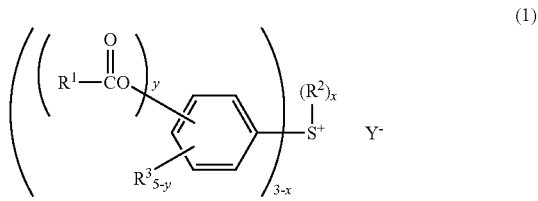

wherein $R^1$ represents an alkyl group having 1 to 20 carbons, an alkenyl group, an oxo-alkyl group or an oxo-alkenyl group (a hydrogen atom in these groups may be substituted with a fluorine atom); $R^2$ represents an alkyl group, an alkenyl group, an oxo-alkyl or oxo-alkenyl group, an aryl group having 6 to 20 carbons, or an aralkyl or aryloxo-alkyl group having 7 to 20 carbons; $R^3$ represents a hydrogen atom or an alkyl group; x represents an integer of 0 to 2; y represents an integer of 1 to 5; two $R^2$s may form a ring when x is 2; $R^2$ represents an alkylene group having 1 to 12 carbons when the ring is formed; and $Y^-$ represents a non-nucleophilic opposed ion.

The alkyl group of $R^1$ includes linear, branched, or cyclic alkyl groups having 1 to 20 carbons, preferably 1 to 6 carbons. Specifically, methyl group, ethyl group, propyl group, isopropyl group, n-butyl group, sec-butyl group, tert-butyl group, pentyl group, hexyl group, heptyl group, octyl group, cyclopentyl group, cyclohexyl group, cycloheptyl group, cyclopropyl methyl group, 4-methylcyclohexyl group, cyclohexyl methyl group, norbornyl group, adamantyl group and the like are included.

The alkenyl group of $R^1$ may be linear, branched, or cyclic, and includes those having 1 to 20 carbons, preferably 1 to 6 carbons. Specifically, vinyl group, allyl group, propenyl group, butenyl group, hexenyl group, cyclohexenyl group and the like are included.

$R^1$ representing an oxoalkyl group includes specifically, 2-oxocyclopentyl group, 2-oxocyclohexyl groups and the like, and 2-oxopropyl group, 2-cyclopentyl-2-oxoethyl group, 2-cyclohexyl-2-oxoethyl group, 2-(4-methylcyclohexyl)-2-oxoethyl group and the like are included.

In addition, the composition in which a hydrogen atom of R1 is substituted with a fluorine atom can improve the acid strength of acid to be generated, and it can further improve an undercut profile and scum.

The alkyl group, the alkenyl group, and the oxoalkyl group of $R^2$ are the similar groups to $R^1$.

The aryl group of $R^2$ includes those having 6 to 20 carbons, preferably 6 to 14 carbons. Specifically, phenyl group, naphthyl group and the like; alkoxyphenyl groups such as p-methoxyphenyl group, m-methoxyphenyl group, o-methoxyphenyl group, ethoxyphenyl group, p-tert-butoxyphenyl group, and m-tert-butoxyphenyl group; alkylphenyl groups such as 2-methylphenyl group, 3-methylphenyl group, 4-methylphenyl group, ethylphenyl group, 4-tert-butylphenyl group, 4-butylphenyl group, and dimethylphenyl group; alkylnaphthyl groups such as methylnaphthyl group, and ethylnaphthyl group; alkoxynaphthyl groups such as methoxynaphthyl group, and ethoxynaphthyl group; dialkylnaphthyl groups such as dimethylnaphthyl group, and diethylnaphthyl group; dialkoxynaphthyl groups such as dimethoxynaphthyl group, and diethoxynaphthyl group are included.

The aralkyl group of $R^2$ includes groups having 7 to 20 carbons, preferably 7 to 12 carbons. Specifically, benzyl group, phenylethyl group, phenethyl group are included.

The aryloxoalkyl group of $R^2$ includes those having 7 to 20 carbons, preferably 7 to 12 carbons. Specifically, 2-aryl-2-oxoethyl groups such as 2-phenyl-2-oxoethyl group, 2-(1-naphthyl)-2-oxoethyl group, and 2-(2-naphthyl)-2-oxoethyl group are included.

When x is 2, two $R^2$s may be the same or different from each other, or may combine together to form a ring. When two $R^2$s combine together to form a ring, $R^2$ represents an alkylene group having 1 to 12 carbons, preferably 1 to 6 carbons.

The alkyl group of $R^3$ includes linear, branched, or cyclic alkyl groups having 1 to 20 carbons, preferably 1 to 6 carbons. Specifically, methyl group, ethyl group, propyl group, isopropyl group, n-butyl group, sec-butyl group, tert-butyl group, pentyl group, hexyl group, heptyl group, octyl group, cyclopentyl group, cyclohexyl group, cycloheptyl group, cyclopropylmethyl group, 4-methylcyclohexyl group, cyclohexylmethyl group, norbornyl group, adamantyl group and the like are included.

$Y^-$ representing the non-nucleophilic opposed ion includes a halide ion such as a chloride ion, and a bromide ion, and an ion represented by the following formulas (c-1), (c-2), and (c-3).

$(R^{201}SO_2)O^-$            (c-1)

$(R^{202}SO_2)_2N^-$            (c-2)

$R^{203}COO^-$            (c-3)

In the formulas, $R^{201}$, $R^{202}$, and $R^{203}$ represent an alkyl group in which a hydrogen atom may be substituted with a fluorine atom; or an aryl group, which may have a substituent. $R^{201}$, $R^{202}$, and $R^{203}$ include the similar groups to $R^2$.

In addition, two $R^{202}$s may be the same or different from each other, or may combine together to form a ring. When two $R^{202}$s combine together to form a ring, $R^{202}$ represents an alkylene group having 1 to 12 carbons, preferably 1 to 6 carbons.

The thermal acid generator for antireflective film formation includes compounds represented by the formulas (1a) (1b), (1d), (1e), and the like.

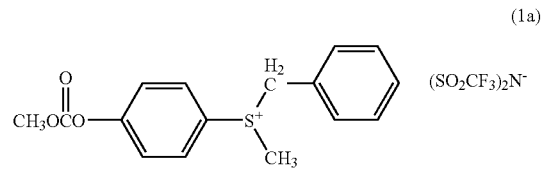

(1a)

(1b)

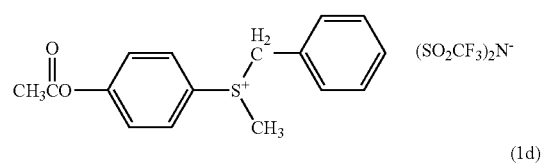

(1d)

(1e)

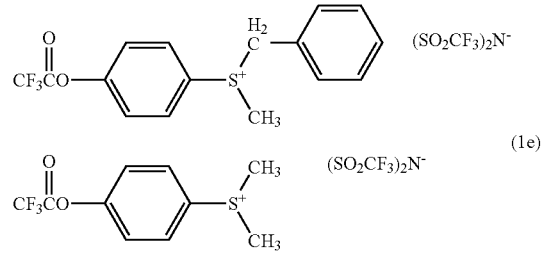

When the thermal acid generator for formation of the antireflective film is applied in a composition for formation of the antireflective film to form the antireflective film, generation of an undercut profile or scum can be prevented in the resist pattern formed on the antireflective film.

The reason and the like why the above-mentioned effect is achieved has not been determined; however, it is inferred that two kinds of acids generated from the thermal acid generator for antireflective film formation in the present invention (acids generating from a site of an onium salt and acids generated from a site of $R^1$—COO—) are affected. The thermal acid generator for antireflective film formation of the present invention can be expressed in other words with the acids generator to generate more than two kinds of acids.

A composition for formation of an antireflective film of the present invention includes a silicon-containing compound having a light-absorbing group and a crosslinking group and the thermal acid generator for formation of the antireflective film.

The thermal acid generator for formation of the antireflective film may be used alone, or in combination of two or more thereof.

The additive amount of the thermal acid generator for formation of the antireflective film is preferably 0.1 to 50 parts by mass, and more preferably 0.5 to 40 parts by mass based on 100 parts by mass of the silicon-containing compound as described below. The additive amount of 0.1 parts by mass or more can sufficiently exhibit accelerative effect for crosslinking reaction.

An additional thermal acid generator, photoacid generator, thermal base generator, and photobase generator may be combined other than the thermal acid generator for antireflective film formation.

The silicon-containing compound of the present invention includes a light-absorbing group and a crosslinking group.

The light-absorbing group may be a group having absorption at a wavelength in the range of 150 to 300 nm. Examples of this light-absorbing group include groups having a light-absorbing moiety, such as a benzene ring, an anthracene ring, a naphthalene ring, or the like. The light-absorbing moiety is preferably bound to an Si atom of the main skeleton via an alkylene group having 1 to 20 carbon atoms which may be interrupted by one or more —O—, or —O(CO)—. In addition, the light-absorbing moiety such as a benzene ring, an anthracene ring, or a naphthalene ring may be substituted with one or more substituents such as an alkyl group having 1 to 6 carbon atoms, a hydroxy group, or the like. Among these light-absorbing groups, a benzene ring is preferred. Also, a group having an absorption moiety containing an Si—Si bond can be used in addition to the absorption group described above. This light-absorbing moiety may be included in the main skeleton of the silicon-containing compound.

Moreover, the crosslinking group described below may be bound to the light-absorbing moiety.

The crosslinking group refers to a group capable of reacting with other crosslinking group, or capable of reacting with a crosslinking agent otherwise added. Examples of the crosslinking group include a hydrosilyl group, or crosslinkable organic groups. This crosslinking group preferably forms crosslinkage upon heating and include organic groups having an epoxy group, a glycidyl group, and an oxetanyl group. These organic groups having an epoxy group and/or an oxetanyl group are preferably bound to a Si atom via an alkylene group having 1 to 20 carbon atoms which may be interrupted by one or more —O—, or —O(CO)—. The crosslinking group having an oxetanyl group is most preferable for storage stability reasons.

Preferable examples of the cross-linking groups include an alkyl group having 1 to 40 carbon atoms (provided that it may have an ether bond) with an epoxy group, a glycidyl group or an oxetanyl group. It is preferred that the cross-linking group is in particular an alkyl group having 1 to 40 carbon atoms (however, it may have an ether bond) with an oxetanyl group. Furthermore, it is preferred that the cross-linking group is —(CH$_2$)$_d$O(CH$_2$)$_e$C(CH$_2$OCH$_3$)(CH$_2$)$_f$CH$_3$, wherein d is an integer from 1 to 20, e is an integer from 1 to 20, and f is an integer from 0 to 20.

By using of the silicon-containing compound to which such a crosslinking group is introduced, a stable antireflective film can be formed by baking at a low temperature of 150 to 350° C., preferably 150 to 250° C.

The silicon-containing compound includes, for example, a siloxane compound, a silicon carbide compound, a polysilicon compound, a silazane compound, and the like. The weight average molecular weight of these silicon-containing compounds (based on conversion into polystyrene on gel permeation chromatography) is not particularly limited, but is preferably 200 to 10000, and more preferably 500 to 5000. This is mainly because formability and flatness of film are secured, and the etching resistance is excellent.

More specifically, the siloxane compound represents a siloxane compound (A) having a constitutional unit represented by the following general formulas (a1) and (a2),

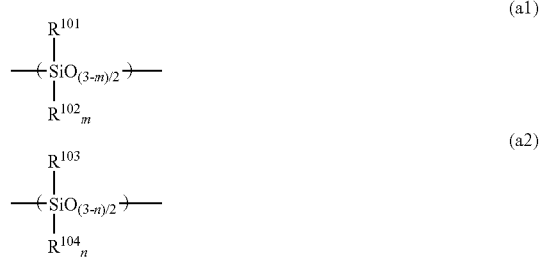

wherein, $R^{101}$ represents a light-absorbing group; $R^{103}$ represents a crosslinking group; $R^{102}$ and $R^{104}$ each represent a hydrogen atom, a hydroxy group, or an alkyl group having 1 to 3 carbon atoms; and each of m and n represents 0 or 1.

When m and n are 0, the siloxane compound is silsesquioxane, which is a polymer having a silicone ladder structure. When m and n are 1, the siloxane compound is a straight silicone polymer. Otherwise, the siloxane compound will be the corresponding copolymer thereof. Particularly, silicone ladder type siloxane compounds are preferable in terms of time dependent stability of the composition for formation of an antireflective film.

The siloxane compound including the constitutional units (a1) and (a2) can be obtained by hydrolysis and condensation of a mixture including the following silicon-containing compounds (a1') and (a2'),

wherein, $R^{101}$, $R^{102}$, $R^{103}$ $R^{104}$, m and n are as defined above; X represents a halogen group, a hydroxy group, or an alkoxy group having 1 to 5 carbon atoms; Xs may be the same or different when a plurality of Xs are present.

In addition, the third constitutional unit may be introduced by using a silicon-containing compound (a3) having a hydrolyzable group (corresponding to X) other than the above-mentioned hydrolyzable groups.

The amount of water to be added in the hydrolysis reaction is preferably 0.2 to 10 mole of water based on 1 mole of a monomer. In this process, a catalyst can be also used. Examples of the catalyst include acids such as acetic acid, propionic acid, oleic acid, stearic acid, linoleic acid, salicylic acid, benzoic acid, formic acid, malonic acid, phthalic acid, fumaric acid, citric acid, tartaric acid, hydrochloric acid, sulfuric acid, nitric acid, sulfonic acid, methylsulfonic acid, tosylic acid, and trifluoromethanesulfonic acid; bases such as ammonia, sodium hydroxide, potassium hydroxide, barium hydroxide, calcium hydroxide, trimethylamine, triethylamine, triethanolamine, tetramethylammonium hydroxide, chlorine hydroxide, and tetrabutylammonium hydroxide; metal chelate compounds such as tetraalkoxytitanium, trialkoxymono(acetylacetonate)titanium, tetraalkoxyzirconium, and trialkoxymono(acetylacetonate)zirconium. Moreover, when an oxetanyl group, an epoxy group or the like is included as the crosslinking group, it is preferred that system environment with a pH of 7 or greater be provided so as not to permit ring opening. Thus, an alkaline agent such as ammonia, a quaternary ammonium salt, an organic amine, or the like is preferably used. In particular, tetraalkylammonium hydroxide is preferably used in terms of favorable activity as a base catalyst, and ease in controlling the reaction.

In addition, it is preferred that the siloxane compound be treated with a silylation agent.

Examples of the silylation agent include trimethylmethoxysilane, hexamethyldisilazane, tetramethyldibutyldisilazane, hexaethyldisilazane, tetramethyldivinyldisilazane, tetravinyldimethyldisilazane, N-trimethylsilylacetamide, N,O-bis(trimethylsilyl)acetamide, N-trimethylsilylimidazole, and the like. The silylation agent is preferably hexaalkyldisilazane, and particularly hexamethyldisilazane. In such a way, storage stability can be improved by treating with a silylation agent.

In the siloxane compound (A), the constituent unit (a1) is preferably 0.01 to 99% by mole, more preferably 0.1 to 70% by mole, and even more preferably 0.15 to 30% by mole. By having the range described above, the light absorption characteristic can be improved. Particularly, when an ArF laser, i.e., the wavelength of which is 193 nm is employed in exposure of the resist film, it is necessary to arrange so that the antireflective film can be formed having an optical parameter (k value) for a light with this wavelength falling within the range of 0.002 to 0.95, preferably 0.01 to 0.7, and more preferably 0.05 to 0.25. This arrangement can be made by varying the proportion of the constituent unit (1).

In addition, in the siloxane compound (A), the constituent unit (a2) accounts for preferably 0.01 to 99% by mole, more preferably 0.1 to 70% by mole, and even more preferably 0.15 to 30% by mole. By having the range described above, the hardening properties of the formed antireflective film can be improved, thereby minimizing mixing with the upper layer and cracking.

Furthermore, in the siloxane compound, it is preferred that the carbon number per SiO unit be predetermined with respect to 0 to 6.

Particularly, the silicon-containing compound having an absorption moiety in the main skeleton preferably includes the silicon carbide compound represented by the following formula (B),

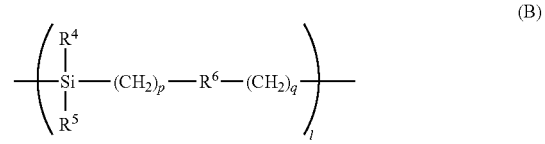

wherein $R^{301}$ and $R^{302}$ are monovalent organic groups; at least either of $R^{301}$ or $R^{302}$ is a crosslinking group; $R^{303}$ is a light-absorbing group; for example, representing an arylene group; p and q are integers of 0 to 20 respectively; l is an integer representing the number of repetitive units, preferably within the range of 5 to 200.

In addition, the monovalent organic group as $R^{301}$ or $R^{302}$ includes an alkyl group and an aryl group having 1 to 40 carbon atoms.

A compound represented by the formula (B') is subjected to a hydrosilylation reaction with a compound having a carbon-carbon double bond on its molecular end and a crosslinking group as a residual group on the double bond, resulting in the compound represented by the formula (B).

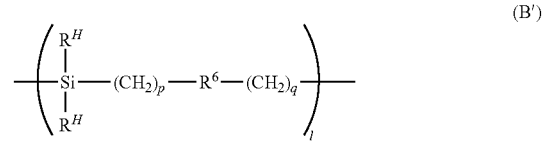

In the formula (B'), RH is a monovalent organic group that corresponds to a hydrogen atom, $R^{301}$, or $R^{302}$; and at least one of two RHs is a hydrogen atom.

In addition, the compound represented by the formula (B') is easily obtained by conducting Grignard reaction of the following formulas (b'1) and (b'2).

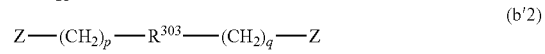

In the formulas, Z represents a halogen atom.

When the compound contains no absorption moiety in its main skeleton (i.e., $R^{303}$ is absent), any compound in which either of $R^{301}$ or $R^{302}$ having a light-absorbing group can be also used.

The composition for formation of an antireflective film of the present invention preferably contains a solvent. Examples of this solvent include: monohydric alcohols such as methyl alcohol, ethyl alcohol, propyl alcohol, and butyl alcohol; polyhydric alcohols such as ethylene glycol, diethylene glycol, propylene glycol, glycerin, trimethylolpropane, and hexanetriol; monoethers of a polyhydric alcohol such as ethylene glycol monomethyl ether, ethylene glycol monoethyl ether, ethylene glycol monopropyl ether, ethylene glycol monobutyl ether, diethylene glycol monomethyl ether, diethylene glycol monoethyl ether, diethylene glycol monopropyl ether, diethylene glycol monobutyl ether, propylene glycol monomethyl ether, propylene glycol monoethyl ether, propylene glycol monopropyl ether, and propylene glycol monobutyl ether; esters such as methyl acetate, ethyl acetate, butyl acetate, and ethyl lactate; ketones such as acetone, methyl ethyl ketone, cycloalkyl ketone, and methyl isoamyl ketone; polyhydric alcohol ethers obtained by alkyl etherification of all hydroxyl groups of a polyhydric alcohol such as ethylene glycol dimethyl ether, ethylene glycol diethyl ether, ethylene glycol dipropyl ether, ethylene glycol dibutyl ether, propylene glycol dimethyl ether (PGDM), propylene glycol diethyl ether, propylene glycol dibutyl ether, diethylene glycol dimethyl ether, diethylene glycol methylethyl ether, and diethylene glycol diethyl ether; and the like. Among these, cycloalkyl ketone or alkylene glycol dialkyl ether is more suitable. Moreover, PGDM (propylene glycol dimethyl ether) is suitable as the alkylene glycol dimethyl ether. These organic solvents may be used alone, or in combination of two or more thereof. This solvent is preferably used by ratio of 1 to 50 times, preferably 2 to 20 times as the silicon-containing compound.

A crosslinking agent for accelerating the crosslinking reaction, and for improving hardening properties of the antireflective film, may be added to the composition for formation of an antireflective film of the present invention.

Examples of this crosslinking agent include epoxy compounds such as bisphenol A epoxy resin, bisphenol F epoxy resin, bisphenol S epoxy resin, phenol novolak epoxy resin, and cresol novolak epoxy resin; compounds having two or more reactive groups such as divinylbenzene, divinylsulfone, triacryl formal, glyoxal and acrylic acid esters or methacrylic acid esters of a polyhydric alcohol, and compounds obtained by substitution of at least two amino groups of melamine, urea, benzoguanamine or glycoluril with a methylol group or a lower alkoxy methyl group; and the like.

The crosslinking agent can be used alone, or in a combination of two or more.

The additive amount of the crosslinking agent is preferably 0.1 to 50 parts by mass, and more preferably 0.5 to 40 parts by mass per 100 parts by mass of the silicon-containing compound. The additive amount of 0.1 parts by mass or more can sufficiently exhibit accelerative effect for crosslinking reaction. Moreover, by adding in an amount of 50 parts by mass or less, the crosslinking reaction can be further accelerated, and thus the hardening property of the antireflective film can be further improved.

Pattern Formation Method

A pattern formation method in which the composition for formation of an antireflective film of the present invention is used will be described as follows. This pattern formation method is a method for forming a pattern on a workpiece film such as a substrate or the like by lithography.

The present pattern formation method has at least the following steps (1) to (4):

(1) coating the composition for formation of an antireflective film of the present invention on a workpiece film, and baking to form an antireflective film;

(2) coating a photoresist composition on an antireflective film, and prebaking to form a photoresist film;

(3) exposing a pattern circuit region of the photoresist film, followed by developing with a liquid developer to form a resist pattern; and (4) etching the antireflective film and a substrate using the resist pattern to form a pattern on the workpiece film as a mask.

In the pattern formation method described above, a pattern was formed on a workpiece film by etching an antireflective film and a workpiece film using a resist pattern as a mask; however, a pattern can be also formed on a workpiece film by etching an antireflective film using a resist pattern as a mask, and further etching a workpiece film using as a mask the antireflective film on which the pattern was formed.

Moreover, it is preferred that a lower layer film (bottom layer) be formed between the workpiece film and the antireflective film described above. Examples of the method for forming a pattern on the workpiece film in this instance include: (i) a method in which a pattern is formed on a workpiece film by etching an antireflective film, a lower layer film and the workpiece film using a resist pattern as a mask; (ii) a method in which a pattern is formed on a workpiece film by etching an antireflective film using a resist pattern as a mask, and further etching a lower layer film and the workpiece film using the antireflective film on which the pattern was formed as a mask; (iii) a method in which a pattern is formed on a workpiece film by etching an antireflective film using a resist pattern as a mask, and further etching a lower layer film and the workpiece film using the antireflective film on which the pattern was formed as a mask; (iv) a method in which etching an antireflective film and a lower layer film using a resist pattern as a mask is followed by further using the lower layer film on which the pattern was formed as a mask to form a pattern on a workpiece film; and the like.

Herein, the lower layer film includes a resin such as cresol novolak, naphthol novolak, katol dicyclopentadiene novolak, amorphous carbon, polyhydroxystyrene, acrylate, methacrylate, polyimide, polysulfone, and the like.

The antireflective film requires adjustment of etching rate in accordance with the etching rate of the upper layer and/or the lower layer as described above.

The composition for formation of an antireflective film of the present invention is used in applications in which patterning of a workpiece film is performed using a resist pattern, an antireflective film, and a lower layer film. In particular, the aforementioned method (ii) in which a pattern is formed on a workpiece film by etching an antireflective film using a resist pattern as a mask, and further etching a lower layer film and the workpiece film using the antireflective film on which the pattern was formed as a mask is preferably used.

For forming this antireflective film, the composition for formation of an antireflective film may be spin-coated on the workpiece film or the lower layer film, dried, and then heated. Heating may be conducted by a process with single or multiple heating steps. When the process with multiple heating steps is employed, the heating can be conducted, for example, at 100 to 120° C. for 60 to 120 sec, and then at 200 to 250° C. for 60 to 120 sec. Accordingly, after forming the antireflective film having, for example a thickness of 30 to 200 nm, a resist film may be produced thereon with a resist material to provide a thickness of 100 to 300 nm by a common procedure. The lower layer film may be formed on the workpiece film in the similar way of forming the antireflective film to give, for example, a thickness of 200 to 600 nm.

The composition for formation of an antireflective film of the present invention can be readily coated on a base material such as a silicon wafer using a commonly employed spin coating process, thereby enabling the antireflective film having a desired thickness to be formed. Taking into account the necessity of forming an oxidized film on a base material by vapor deposition and providing a resist film thereon in conventional resist processes, it can be understood that formation of an antireflective film significantly simplified.

Any known resist composition may be used in forming the resist layer. For example, a combination of a base resin, an organic solvent and an acid generator can be used.

Examples of the base resin include one or more high molecular weight polymers selected from a group consisting of: polyhydroxystyrene and derivatives thereof; polyacrylic acid and derivatives thereof; polymethacrylic acid and derivatives thereof; copolymers formed through selecting from hydroxystyrene, and acrylic acid and methacrylic acid, and derivatives thereof; three or more copolymers selected from cycloolefin and derivatives thereof, and maleic anhydride and acrylic acid, and derivatives thereof; three or more copolymers of selected from cycloolefin and derivatives thereof, maleimide and acrylic acid, and derivatives thereof; polynorbornene, and ring-opening metathesis polymers. The derivatives herein refer to those with a main skeleton remaining after the derivation so as to include acrylate ester or the like in acrylic acid derivatives, methacrylate ester or the like in methacrylic acid derivatives, alkoxystyrene or the like in hydroxystyrene derivatives.

Examples for resists for KrF excimer laser include copolymers formed through selecting from polyhydroxystyrene (PHS), hydroxystyrene, and styrene, acrylic acid ester, methacrylic acid ester, and maleimide N-carboxylic acid ester; while examples for resists for ArF excimer laser include those of acrylic ester-based, methacrylic ester-based, alternating copolymerization system of norbornene and maleic anhydride, alternating copolymerization system of tetracyclododecene and maleic anhydride, polynorbornene-based, and metathesis polymerization system by ring-opening polymerization, but are not limited to these polymers of the polymerization system.

EXAMPLES

Hereinafter, the present invention will be explained in more detail by way of Examples; however the present invention is not limited by these Examples.

Silicon-Containing Compound

Synthesis Example 1-1

The monomers represented by the following formulas (a'1-1a) and (a'2-1) were hydrolyzed and polymerized to obtain the siloxane compound (A1) (molecular weight Mw: 800, a:b=1:1) including the constitutional unit represented by the following formula (A1).

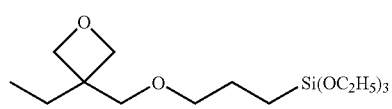

(a' 1-1)

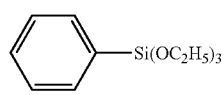

(a' 2-1)

-continued

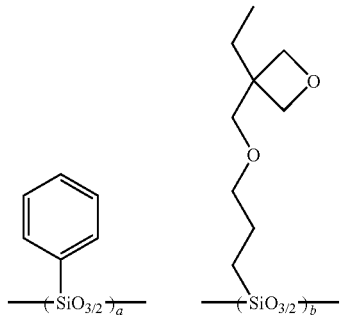

(A1)

Synthesis Example 1-2

First, a tetrahydrofuran solution in which magnesium is activated by adding 1,2-dibromoethane was added dropwise to a tetrahydrofuran solution of 1,4-dibromobenzene and dichloromethyl silane to be reacted, whereby polycarbosilane represented by the following formula was obtained.

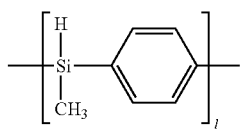

This toluene solution of polycarbosilane and 3-ethyl-3-allyloxy methyloxetan was heated, and a xylene solution of a 1,3-divinyl-1,1,3,3-tetramethyldisiloxane platinum complex was added therein to be reacted, whereby the silicon carbide compound represented by the following formula (B1) was obtained. The molecular weight of this compound was 4000.

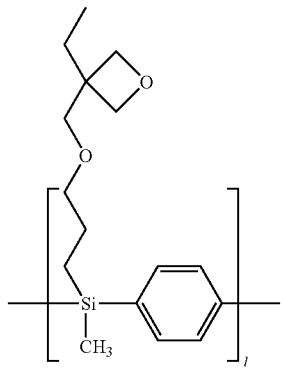

(B1)

Thermal Acid Generator

Synthesis Example 2-1

Synthesis of the Compound
(benzyl-4-hydroxyphenylmethylsulfonium
bis(trifluoromethane sulfonyl)imide) Represented by
the Following Formula (1c)

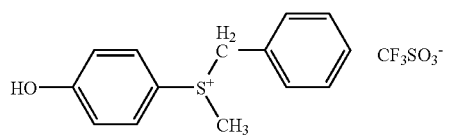

(1c)

30 g (0.11 mol) of benzyl-4-hydroxyphenylmethylsulfonium chloride obtained by reacting benzyl chloride with 4-hydroxyphenylmethyl sulfide was dissolved in 500 mL of water, 33.9 g (0.118 mol) of bis(trifluoromethane sulfonyl) imide lithium and 500 mL of ethyl acetate were added thereto, and then stirred at 5 to 10° C. for two hours. The water layer was removed, the organic layer was dried, and then the reaction solution was concentrated under reduced pressure and dried under vacuum. The resulting oily matter was treated with hexane, and then dried under vacuum again. Then, 44.1 g of benzyl-4-hydroxyphenylmethylsulfonium bis(trifluoromethane sulfonyl)imide was obtained in a white crystal (yield: 76.7%). The melting point was 76 to 80° C.

Synthesis Example 2-2

Synthesis of the Compound
4-methoxycarbonyloxyphenylbenzylmethylsulfonium
bis(trifluoromethane sulfonyl)imide) Represented by
the Formula (1a)

17 g (0.033 mol) of the compound represented by the formula (1c) was dissolved in 300 ml of acetonitrile, 3.5 g (0.035 mol) of triethylamine was added at 10° C. or less, and 30 minutes later, methoxycarbonyl chloride (0.035 mol) was added dropwise. Hydrochloride of triethylamine which was obtained as a by-product was filtered to be removed after three hour stirring, and then the acetonitrile layer was concentrated under reduced pressure. As the result, 4-methoxycarbonyloxyphenylbenzylmethylsulfonium bis(trifluoromethane sulfonyl)imide) was obtained in a light brown clear viscous liquid.

Synthesis Example 2-3

Synthesis of the Compound
4-acetoxyphenylbenzylmethylsulfonium
bis(trifluoromethane sulfonyl)imide) Represented by
the Formula (1b)

17 g (0.033 mol) of the compound represented by the formula (1c) was dissolved in 300 ml of acetonitrile, 3.5 g (0.035 mol) of triethylamine was added at 10° C. or less, and 30 minutes later, 2.7 g (0.035 mol) of acetyl chloride was added dropwise. Hydrochloride of triethylamine which was obtained as a by-product was filtered to be removed after three hour stirring, and then the acetonitrile layer was concentrated under reduced pressure. As the result, 9.4 g of 4-acetoxyphenylbenzilmethylsulfonium bis(trifluoromethane sulfonyl)imide) was obtained in a light brown clear viscous liquid (yield: 51.5%).

Example 1

By using 100 parts by mass of the siloxane compound (A1), 2 parts by mass of the compound represented by the formula (1a) as a thermal acid generator, and 3000 parts by mass of propylene glycol monomethylether acetate as a solvent, the composition for formation of hard mask (antireflective film) was prepared.

Pattern Formation

By using a conventional resist coater on a silicon wafer, the prepared composition for forming a hard mask was coated, and heat treatment was carried out under conditions of 80° C. for 60 sec, 150° C. for 60 sec, and 250° C. for 60 sec to form a hard mask having a thickness of 40 nm.

Furthermore, a resist composition was coated on the hard mask to form a resist layer, and a line pattern with 120 nm space/120 nm pitch was formed by exposure with an ArF exposure apparatus (manufactured by Nikon Corporation, S-302A) through the mask, followed by development.

The obtained resist pattern shape (a cross-section) was observed regarding generation of an undercut profile and scum. The results are shown in Table 1.

The resist composition was prepared by mixing each of the following components:

resin: 100 parts by mass of a resin having a unit (C1:C2: C3=4:4:2, molecular weight: 10000) represented by the following formulas:

(C1)

(C2)

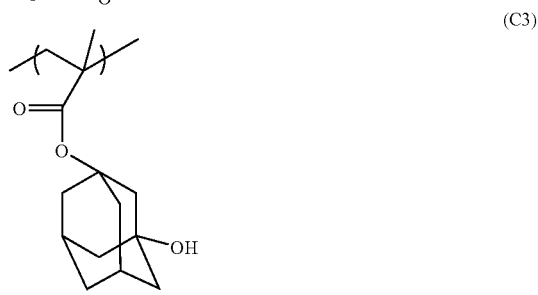

(C3)

acid generator: 1) 2.0% by mass of a compound represented by the following formula:

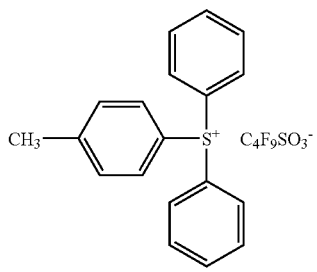

2) 0.8% by mass of a compound represented by the following formula:

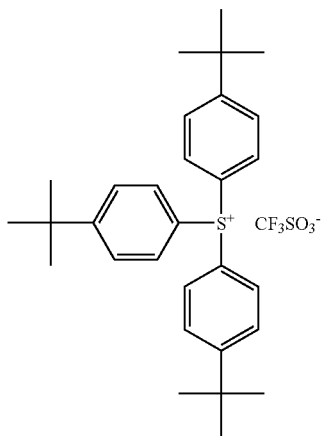

acid quencher: 1) 0.25% by mass of triethanolamine 2) 25.0% by mass of γ-butyrolactone Solvent: propylene glycol monomethyl ether acetate:propylene glycol monomethyl ether=6:4 was combined, whereby the preparation was used.

TABLE 1

|  | Undercut Profile | Scum |
| --- | --- | --- |
| Example 1 | Not Found | Not Found |
| Example 2 | Not Found | Not Found |
| Example 3 | Not Found | Not Found |
| Example 4 | Not Found | Not Found |
| Example 5 | Not Found | Not Found |
| Comparative Example 1 | Found | Found |

Example 2

A hard mask and a resist pattern were formed in a similar manner to Example 1 except that the compound represented by the formula (1b) generator was used as a thermal acid. The resist pattern shape was evaluated. The results are shown in Table 1.

Example 3

A hard mask and a resist pattern were formed in a similar manner to Example 1 except that the silicon carbide compound (B1) was used instead of the siloxane compound (A1) was used. The resist pattern shape was evaluated. The results are shown in Table 1.

Example 4

A composition for forming hard mask (composition for forming antireflection layer) was prepared in a similar manner to Example 1 except that the compound represented by the formula (1d) was used as a thermal acid generator.

Pattern Formation

The prepared composition for forming a hard mask was coated on the silicon wafer by using a conventional resist coater, and heat treatment was carried out under conditions of 250° C. for 90 sec to form a hard mask having a thickness of 45 nm.

Furthermore, a resist composition was coated on the hard mask to form a resist layer, and a line pattern with 120 nm space/120 nm pitch was formed by exposure with an ArF exposure apparatus (manufactured by Nikon Corporation, S-302A) through the mask, followed by development. The resist pattern shape was evaluated. The same results are shown in Table 1. The resist composition as that of example 1 was used.

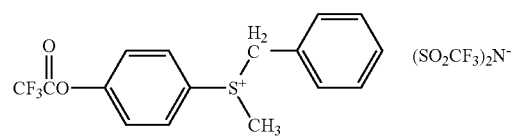

Example 5

A hard mask and a resist pattern were formed in a similar manner to Example 1 except that the compound represented by the formula (1e) was used as a thermal acid generator. The resist pattern shape was evaluated. The results are shown in Table 1.

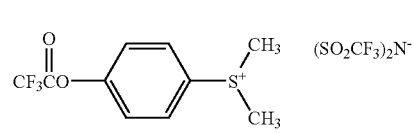

Comparative Example 1

A hard mask and a resist pattern were formed in a similar manner to Example 1 except that the compound represented by the formula (1c) was used as a thermal acid generator. The resist pattern shape was evaluated.

The results are shown in Table 1.

The invention claimed is

1. A thermal acid generator for formation of an antireflective film represented by the following formula (1),

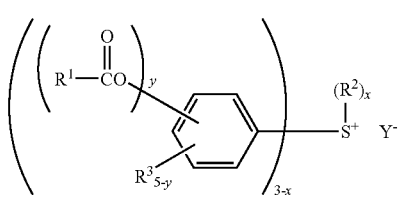

(1)

wherein $R^1$ represents an alkyl group, an alkenyl group, an oxo-alkyl group or an oxo-alkenyl group, in which a hydrogen atom is substituted with a fluorine atom; $R^2$ represents an alkyl group, an alkenyl group, an oxo-alkyl or oxo-alkenyl group, or an aralkyl or aryloxo-alkyl group; $R^3$ represents a hydrogen atom or an alkyl group; x represents an integer of 0 to 2; y represents an integer of 1 to 5; two $R^2$s may be the same or different from each other and may form a ring when x is 2; $R^2$ represents an alkylene group having 1 to 12 carbons when the ring is formed; and $Y^-$ represents a non-nucleophilic opposed ion represented by the following formula (c-2), $(R^{202}SO_2)_2N^-$         (c-2)

wherein $R^{202}$ represents an alkyl group in which a hydrogen atom may be substituted with a fluorine atom; or an aryl group, which may have a substituent, and two $R^{202}$s may be the same or different from each other, or may combine to form a ring.

2. The thermal acid generator for formation of an antireflective film according to claim 1, wherein $R^1$ is a linear alkyl group having 1 to 6 carbon atoms or an oxo-alkyl group, in which a hydrogen atom is substituted with a fluorine atom.

3. A composition for formation of an antireflective film comprising: a thermal acid generator for formation of the antireflective film, and a silicon-containing compound having a light-absorbing group and a crosslinking group, wherein the thermal acid generator is represented by the following formula (1),

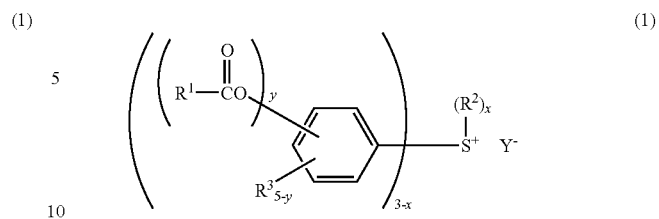

(1)

wherein $R^1$ represents an alkyl group, an alkenyl group, an oxo-alkyl group or an oxo-alkenyl group, in which a hydrogen atom is substituted with a fluorine atom; $R^2$ represents an alkyl group, an alkenyl group, an oxo-alkyl or oxo-alkenyl group, or an aralkyl or aryloxo-alkyl group; $R^3$ represents a hydrogen atom or an alkyl group; x represents an integer of 0 to 2; y represents an integer of 1 to 5; two $R^2$s may be the same or different from each other and may form a ring when x is 2; $R^2$ represents an alkylene group having 1 to 12 carbons when the ring is formed; and $Y^-$ represents a non-nucleophilic opposed ion represented by the following formula (c-2), $(R^{202}SO_2)_2N^-$         (c-2)

wherein $R^{202}$ represents an alkyl group in which a hydrogen atom may be substituted with a fluorine atom; or an aryl group, which may have a substituent, and two $R^{202}$s may be the same or different from each other, or may combine to form a ring.

4. A composition for formation of an antireflective film according to claim 3, wherein the crosslinking group has a hydrosilyl group, an epoxy group, or an oxetanyl group.

5. A composition for formation of an antireflective film according to claim 4, wherein the crosslinking group is an organic group having an oxetanyl group.

6. A composition for formation of an antireflective film according to claim 3, wherein the silicon-containing compound is a siloxane compound or a silicon carbide compound.

7. An antireflective film obtained by coating a composition for formation of an antireflective film according to claim 3, followed by baking.

\* \* \* \* \*